(12) United States Patent
Salfelner

(10) Patent No.: US 9,647,706 B2
(45) Date of Patent: May 9, 2017

(54) ANTENNA TUNING CIRCUIT

(71) Applicant: NXP B.V., Eindhoven (NL)

(72) Inventor: Anton Salfelner, Gratkorn (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/645,198

(22) Filed: Mar. 11, 2015

(65) Prior Publication Data

US 2016/0269060 A1     Sep. 15, 2016

(51) Int. Cl.
| | |
|---|---|
| *H04B 1/18* | (2006.01) |
| *H04B 1/10* | (2006.01) |
| *H03H 7/40* | (2006.01) |
| *H04B 1/04* | (2006.01) |
| *H04B 17/12* | (2015.01) |
| *H04B 17/21* | (2015.01) |
| *H04B 17/00* | (2015.01) |

(52) U.S. Cl.
CPC ............. *H04B 1/1027* (2013.01); *H03H 7/40* (2013.01); *H04B 1/0458* (2013.01); *H04B 1/18* (2013.01); *H04B 17/12* (2015.01); *H04B 17/21* (2015.01); *H04B 17/0085* (2013.01); *H04B 2001/1072* (2013.01)

(58) Field of Classification Search
CPC ... H03J 2200/08; H04B 17/00; H04B 1/1027; H04B 17/12; H04B 17/21; H04B 1/0458; H04B 1/18; H04B 17/0085; H04B 2001/1072; H03H 7/40
USPC ...... 455/77, 107, 115.2, 115.3, 193.1, 193.3, 455/226.1, 226.2
See application file for complete search history.

(56) References Cited

U.S. PATENT DOCUMENTS

| | | | | |
|---|---|---|---|---|
| 6,081,700 | A * | 6/2000 | Salvi ................... | H04B 1/18 455/193.3 |
| 6,862,432 | B1 * | 3/2005 | Kim ..................... | H04B 1/18 343/860 |
| 2008/0233869 | A1 * | 9/2008 | Baker ................... | H03L 7/181 455/41.1 |
| 2010/0144295 | A1 * | 6/2010 | Kroeger ............... | H04B 17/318 455/193.1 |
| 2012/0214421 | A1 * | 8/2012 | Hoirup ................. | H01Q 1/242 455/67.11 |
| 2013/0095775 | A1 * | 4/2013 | Kim ..................... | H04B 1/18 455/84 |
| 2013/0244589 | A1 * | 9/2013 | Schmidhammer ..... | H03H 7/40 455/73 |
| 2014/0030988 | A1 * | 1/2014 | Fu ........................ | H04B 15/00 455/78 |
| 2014/0206296 | A1 * | 7/2014 | Chakraborty ........ | H04B 1/0458 455/77 |
| 2015/0102869 | A1 * | 4/2015 | Wang ................... | H01P 1/36 333/1.1 |

(Continued)

OTHER PUBLICATIONS

Extended European Search Report for Patent Appln. No. 16159793.5 (Mar. 8, 2016).

*Primary Examiner* — Nguyen Vo
(74) *Attorney, Agent, or Firm* — Rajeev Madnawat

(57) ABSTRACT

A system for tuning an impedance network for optimal signal strength is disclosed. The system includes a test tone generator, a radio frequency (RF) receiver, a received signal strength indicator (RSSI) coupled to the RF receiver and a controller coupled to the RSSI. The controller is configured to output a control signal based on a RSSI value measured by the RSSI.

14 Claims, 3 Drawing Sheets

(56) References Cited

U.S. PATENT DOCUMENTS

2015/0108961 A1\* 4/2015 Barlage ............... H02M 3/1563
 323/290
2015/0133064 A1\* 5/2015 Horne ..................... H04B 1/40
 455/77

\* cited by examiner

ANTENNA TUNING CIRCUIT

RELATED APPLICATIONS

This application is related to application Ser. No. 14/645,222, entitled "Impedance Measurement" filed concurrent to this application and being incorporated herein by reference. This application is also related to application Ser. No. 14/645,177, entitled "Impedance Tuning Circuit" filed concurrent to this application and being incorporated herein by reference.

BACKGROUND

Antennas are used in wireless transmitters and receivers. During design and manufacturing phase, these antennas are tuned for optimal performance. However, the environmental changes and other external factors such as device's closeness to an interfering object may cause non optimal signal reception and transmission operation. In order to tune an antenna when a wireless device is in field use, it is necessary to measure impedance.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a system for tuning an impedance network for optimal signal strength is disclosed. The system includes a test tone generator, a radio frequency (RF) receiver, a received signal strength indicator (RSSI) coupled to the RF receiver and a controller coupled to the RSSI. The controller is configured to output a control signal based on a RSSI value measured by the RSSI. The system also includes a control bus coupled to the controller. The control bus is adapted to be coupled to tunable matching circuit including at least one variable capacitor. In some embodiments, at least the one variable capacitor is fabricated inside an integrated circuit along with the controller.

The RF receiver is adapted to receive a signal from the tunable matching network. The tunable matching network includes a plurality of variable components and the tunable matching network is configured to change values of one or more of the plurality of variable components based on the control signal.

The system further includes a digital to analog converter (DAC) coupled to the controller. The DAC is adapted to be coupled to a varicap and cause a change in capacitance of varicap based on a driver signal from the controller. The system may include a switch to switch an impedance tuning mode between a receiver and a transmitter.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

DETAILED DESCRIPTION

So as not to obscure the disclosure, some well-known components are not being shown in figures and also not being discussed in herein. Those components, methods and usages are well within the common knowledge of a person skilled in the art.

Figure 1:
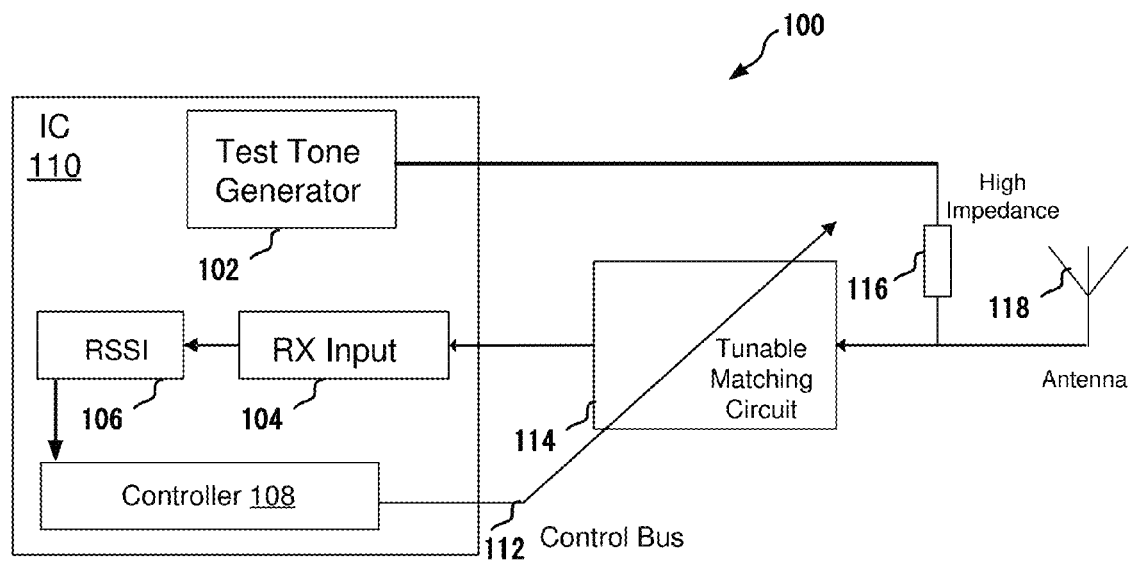
FIG. 1 is a depiction of an example circuit for tuning an externally connected antenna in accordance with one or more embodiments of the present disclosure.

FIG. 1 illustrates schematic portions of a wireless device 100 that includes an integrated circuit (IC) 110 that is designed to be interfaced with an antenna 118. The IC 110 includes a test tone generator 102 that is configured to generate a radio frequency (RF) signal of selected characteristics such as frequency and amplitude. The IC 110 also includes a received signal strength indicator (RSSI) 106 module to measure the strength of a RF input that is received and processed by a RX input module 104. The RX input module 104 is configured to receive RF signals from the antenna 118. The antenna 118 is coupled to a tunable matching circuit 114. The tunable matching circuit 114 may include one or more of resisters, capacitors and inductors. In some embodiments, the tunable matching circuit 114 may include only resistors and capacitors. At least some of the capacitors may be variable capacitors that can be controlled to provide different capacitance values. Similarly, in some embodiments, at least some of the resistors may be variable resisters that can provide difference resistance values based on a control signal.

The test tone generator 102 is coupled to the antenna 118 via a high impedance component 116. In some embodiments, the value of the high impedance component 116 may be in the range of 1 kilo ohm to 2 kilo ohm. In other embodiments, the value of the high impedance component 116 may be high enough such that the presence of the high impedance component 116 does not change the overall impedance of the antenna 118 or the tunable matching circuit 114 measurably significantly. For example, typically the impedance of an antenna is designed in the range of 40 to 800 ohm. In this example, the high impedance component 116 should not alter the impedance of the antenna 118 or the impedance of the tunable matching circuit by more than 20 ohm or in another example, approximately 20%. Typically, the tone generator 102 is configured to produce a RF signal with a frequency that is in the same band for which the wireless device 100 is designed to operate.

The IC 110 also includes a controller 108. In one embodiment, the controller 108 is a digital circuit that produces a control signal based on the value of the measure RSSI and configured to transmit the control signal via a control bus 112 to the tunable matching circuit 114. In one embodiment, the controller 108 may include an analog to digital converter to convert the measured RSSI value to a digital word, e.g., the control signal. In other embodiments, the controller 108 may be a programmable component that can be operated through programming instructions. The control signal is defined to alter the impedance of the tunable matching circuit in correspondence with the measured RSSI.

In one example, when the impedance of the tunable matching circuit 114 is being altered through the control signal, the controller 108 works in a feedback loop in that the controller 108 continues to produce the control signal to alter the impedance of the tunable matching circuit until the highest value of the RSSI is achieved. In one example, the controller 108, at least temporarily, stores the measured RSSI value and compares the newly measured RSSI value with the previously received RSSI value and replaces the stored value with the newly received measured RSSI value if the newly received RSSI value is higher than the previously received RSSI value. In calibration mode, which can be triggered at predefined regular intervals or may be triggered by a user of the wireless device 100, the test tone generator 102 introduces an RF signal to the high impedance component 116 and activates the controller 108 to produce the control signal based on the measured RSSI. In some embodiments, the test tone generator 102 and the high impedance component 116 are not included and the controller 108 continuously or at selected intervals, receives the measured RSSI value, compares the received RSSI value with a previously received RSSI value and if the previously received RSSI value is found to be higher, attempts to tune the tunable matching circuit 114 in an attempt to increase the RSSI.

In one example, the controller 108 may be a digital circuit that, based on the RSSI reading, produces a digital output corresponding to the RSSI reading. In another example, the controller 108 may be implemented in software executable by a processor.

It should be noted that impedance matching is necessary for the best possible energy transfer from stage to stage. Typically, a matching network circuit is used between the antenna and the internal circuit to provide impedance matching between the internal circuit (e.g., a receiver or a transmitter) and the antenna.

Figure 2:
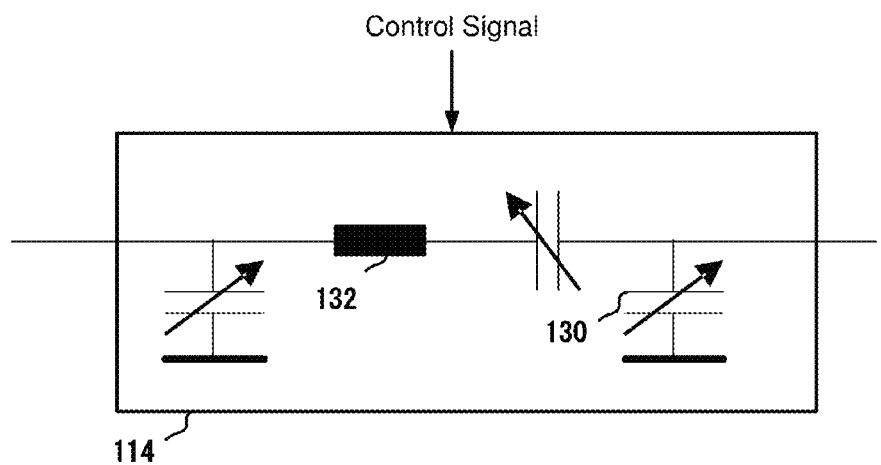
FIG. 2 illustrates schematic of a tunable matching circuit in accordance to one of more embodiments of the present disclosure.

FIG. 2 illustrates the tunable matching circuit 114 in one example. It should be noted that a person skilled in the art would appreciate that a tunable matching circuit 114 can be designed differently so long as the tunable matching circuit 114 provides different impedances based on a control signal. The tunable matching circuit 114 may include at least one or variable capacitors 130, varicap (not shown), variable resisters 132 and variable inductors (not shown). In another embodiment, non-variable components can be used. These non-variable components can be coupled together via switches that are configured to be operated through the control signal. Based on the control signal, some of the switches may be open and some closed thereby introduces different values of at least one of resistance, capacitance and inductance further thereby providing a variable impedance component. A varicap is a special type of diode that has a characteristic of decreasing its capacitance as the reverse voltage increases. In some examples, multiple varicap diodes may be used based on the need for a desired capacitance variation range.

In some example, altering only one of the characteristics such as capacitance may be sufficient. In other example, it may be necessary to alter more than one characteristics, such as capacitance and resistance in the tunable matching circuit 114.

Figure 3:
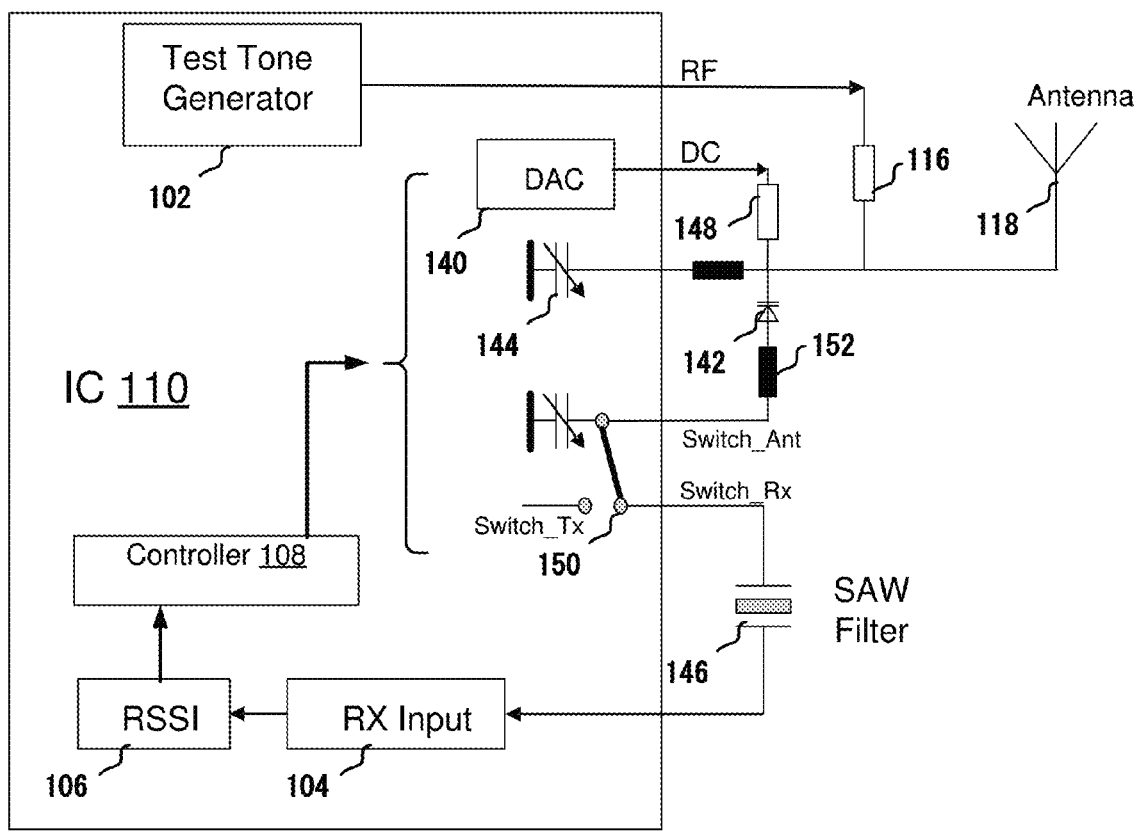
FIG. 3 illustrates a circuit for tuning the antenna using variable capacitors in accordance to one of more embodiments of the present disclosure.

FIG. 3 shows a schematic of portions of a wireless device 100 including the IC 110 in accordance with another embodiment of the present disclosure. In this example, the IC 110 includes some variable components (e.g., variable capacitor 144) inside the IC 110. The IC 110 also includes a digital to analog converter (DAC) 140 coupled to a varicap 142 via a resister 148. The variable components such as variable capacitor 144 are controllable by the controller 108 that outputs a control signal based on the output of the RSSI module 106. The design in this example provides an advantage that at least some parts of the tunable matching network 114 may be fabricated inside the IC 110 thereby simplifying circuit design for wireless systems.

As an example, based on the RSSI readings, the controller 108 may alter the value of the capacitor 144. Alternatively or in addition, the controller 108 may also input a value in the DAC 140 to cause the DAC 140 to output a different voltage. Since the output of the DAC 140 is applied to the varicap 142, the capacitance of the varicap 142 changes. The varicap 142 may be coupled to another variable capacitor through another resister 152.

In one example, the controller 108 is configured to alter the values of variable components slightly in one direction to quickly determine, through the feedback loop, if the RSSI reading is increasing. If the RSSI reading continues to increase, the controller 108 stops altering the variable values when the RSSI value begins to recede. However, upon slight alteration in the variable values, if the RSSI reading goes down, the controller 108 begins to alter the variable values in the other direction. It should be noted that typically altering the variable values to RSSI is not a linear relationship in that the RSSI reading may go up initially and if the values are continued to be altered in the same direction, at some point the RSSI reading will begin to recede. The controller 108 may alter the value of one component first to get a maximum RSSI and then begin to alter the value of another variable component to achieve another maximum RSSI that is higher than the previous maximum RSSI achieved by altering the first variable component value.

The IC 110 may also include a switch 150 to switch the tuning between the receiver and the transmitter mode. In the receiver path, to filter undesired frequencies, a surface acoustic wave (SAW) filter 146 may be employed in one example. The SAW filter is a semiconductor device that is used to filter out desired frequencies. Typically, a SAW filter uses the piezoelectric effect to turn the input signal into vibrations that are turned back into electrical signals in the desired frequency range.

It should be noted that the structure shown in FIG. 3 is merely for example. A person skilled in the art would realize that some components shown therein may be rearranged, added or removed without deviating from the intent of the disclosure. As for example, in some embodiments, the resister 148 may be coupled to the variable capacitor 144 without another resister in between.

Figure 4:
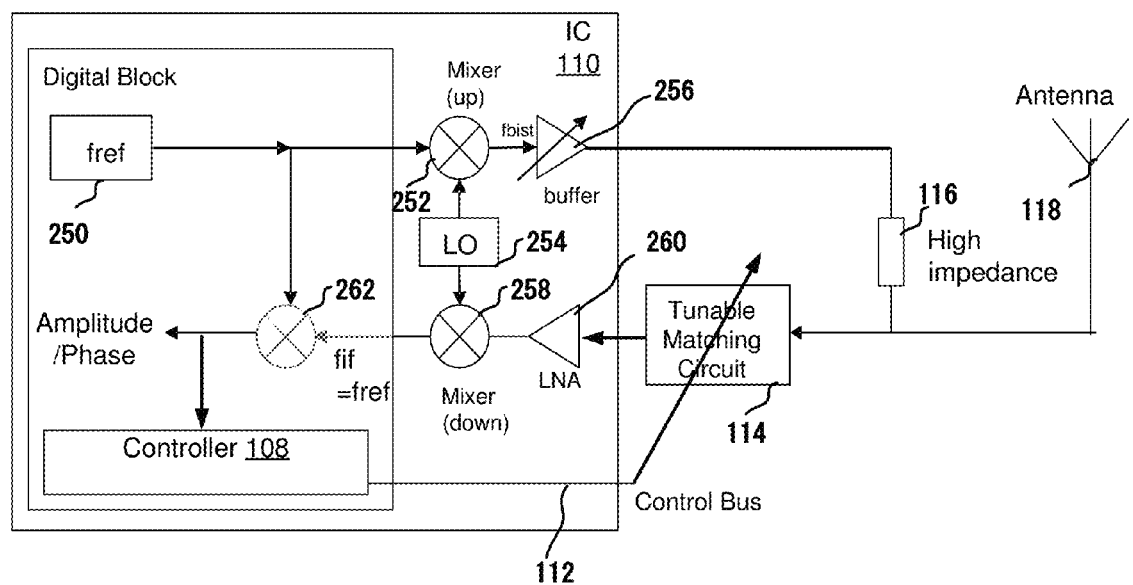
FIG. 4 illustrates a system for tuning the antenna using amplitude and phase measurements in accordance to one of more embodiments of the present disclosure.

FIG. 4 illustrates the schematic of the IC 110 in yet another embodiment. In this embodiment, a plurality of mixers 252, 258, 262 are used. A frequency mixer is a nonlinear electrical circuit that creates new frequencies from two signals applied to it. The up mixer 252 takes a reference signal ($f_{ref}$) 250 and an output of a local oscillator 254 as an input to produce $f_{bist}$ signal of frequency that is a difference between the frequency of the output of the local oscillator 254 and $f_{ref}$ 250. Through a buffer 256 (or an amplifier), $f_{bist}$ is inputted into the receiver path through the impedance component 116. The $f_{bist}$ is filtered through a tunable matching circuit 114 and a low noise amplifier 260 and inputted to a down mixer 258. Another input into the down mixer 258 is the output of the local oscillator 254. The output of the down mixer 258 is inputted to another mixer 262. The second input to the mixer 262 is $f_{ref}$. Amplitude/Phase is measured in the output of the mixer 262. The controller 108 receives the amplitude/phase readings and generates a control signal based on those readings. The control signal is transmitted to the tunable matching circuit 114 via the control bus 112. Based on the control signal, the impedance of the tunable matching circuit is changed. As discussed above, the overall impedance of the tunable matching circuit 114 may be changed by altering values of one or more of variable capacitors, resisters and inductors in the tunable matching circuit 114. The control signal is generated such that the value of a variable component (such as variable capacitor) is changed slightly to determine if the value of amplitude/phase increases. If the value increases, the variable value is altered in the same direction as was done initially. If the value of the amplitude/phase goes down on a slight alternation of a variable component value in the tunable matching network 114, the alternation in the value of the variable component is reversed. An optimum value of amplitude/phase is obtained through altering one or more variable components in the tunable matching network 114. As evident from the discussion above, the change in the impedance of the tunable matching circuit 114 causes a change in amplitude/phase thereby creating a feedback loop and using this feedback loop, the controller 108 can ascertain an optimal tuning of the tunable matching circuit 114. In one example, if $f_{ref}$ is 1 MHz and the local oscillator output is 901 MHz, $f_{bist}$ would be 900 MHz. These frequencies may be selected based on the actual frequency band of a wireless device in which the IC 110 to be used.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A system, including an antenna, for tuning an impedance network for optimal signal strength, the system comprising:
   a radio frequency (RF) receiver;
   a digital to analog converter (DAC);
   a received signal strength indicator (RSSI) coupled to the RF receiver;
   a controller coupled to the RSSI and the DAC, wherein the controller is configured to output a control signal based on a comparison of a RSSI value measured by the RSSI and another previously-provided RSSI value, wherein the control signal is inputted into the DAC to produce an analog signal to change capacitance of a varicap, wherein the controller is configured to receive the RSSI value from the RSSI at preset intervals and store the RSSI value, wherein when a new RSSI value is received the controller compares if the new RSSI value is lower or higher than the stored RSSI value and if the new RSSI value is higher than the stored RSSI value, the controller is configured to store to replace the stored RSSI value by the new RSSI value and not to output the control signal and if the stored RSSI value is lower than the new RSSI value, the controller is configured to output the control signal; and
   a tunable matching circuit, including the varicap and responsive to the analog signal, configured to provide impedance matching for signals between the antenna and the RF receiver.

2. The system of claim 1, further including a control bus coupled to the controller.

3. The system of claim 2, wherein the control bus is adapted to be coupled to the tunable matching circuit including at least one variable capacitor.

4. The system of claim 3, where at least the one-variable capacitor is fabricated inside an integrated circuit along with the controller.

5. The system of claim 3, wherein the tunable matching circuit includes a plurality of variable components and the tunable matching circuit is configured to change values of one or more of the plurality of variable components based on the control signal.

6. The system of claim 1, wherein the RF receiver is adapted to receive a signal from the tunable matching circuit.

7. The system of claim 1, wherein the DAC is adapted to be coupled to the varicap and configured to cause a change in capacitance of the varicap-based on a driver signal from the controller.

8. The system of claim 1, further including a switch configured to switch an impedance tuning mode between a receiver and a transmitter.

9. A system for tuning an impedance network for optimal signal strength, the system comprising:
   a reference frequency generator;
   a first mixer coupled to the reference frequency generator;
   a second mixer;

a local oscillator coupled to the first mixer and the second mixer;

a third mixer coupled to the second mixer and the reference frequency generator; and a controller including circuitry and being coupled to the third mixer, wherein the controller is configured to produce a control signal, based on amplitude and phase value outputted by the third mixer, from which a tunable matching circuit in the impedance network can be tuned.

10. The system of claim 9, wherein the control signal is configured to change impedance of the tunable matching circuit.

11. The system of claim 10, further including the tunable matching circuit.

12. The system of claim 9, wherein an output of the first mixer is configured to provide a test signal to an antenna.

13. The system of claim 12, further including the antenna.

14. The system of claim 9, wherein the control signal is configured to change impedance of the tunable matching circuit, wherein an output of the first mixer is configured to provide a test signal to an antenna, and further including the tunable matching circuit and the antenna.

\* \* \* \* \*